(12) United States Patent
Lan et al.

(10) Patent No.: US 6,645,294 B2
(45) Date of Patent: Nov. 11, 2003

(54) RATIONAL DIRECTIONAL SOLIDIFICATION CRYSTAL GROWTH SYSTEM AND METHOD

(75) Inventors: Chung-Wen Lan, Taipei (TW); Ya-Wen Yang, Ilan (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 10/034,378

(22) Filed: Jan. 3, 2002

(65) Prior Publication Data

US 2003/0079675 A1 May 1, 2003

(30) Foreign Application Priority Data

Oct. 30, 2001 (TW) .................................. 90126926 A (51) Int. Cl.⁷ .............................................. C30B 13/02
(52) U.S. Cl. ...................... 117/81; 117/83; 117/200; 117/204; 117/900
(58) Field of Search ........................ 117/81, 83, 200, 117/204, 900

(56) References Cited

U.S. PATENT DOCUMENTS 6,302,959 B2 * 10/2001 Srivastava et al. ............ 117/81
6,428,617 B1 * 8/2002 Sakuragi et al. ............... 117/11
6,447,603 B2 * 9/2002 Imai et al. ..................... 117/83

* cited by examiner

Primary Examiner—Felisa Hiteshew
(74) Attorney, Agent, or Firm—Birch, Stewart, Kolasch & Birch, LLP (57) ABSTRACT

A rotational directional solidification crystal growth system includes a vertical furnace, a crucible, and a rotate support device. The vertical furnace contains a high-temperature portion and a low-temperature portion. The crucible has a seed well and a growth region. The seed well and the growth region contain a seed crystal and raw material, respectively. The crucible moves from the high-temperature portion of the furnace to the low-temperature portion of the furnace or the thermal profile moves related to a stationary crucible to proceed the crystal growth. The rotation support device supports and rotates the crucible, and the tangent velocity of the rotated crucible is no less than about $5\pi/3$ cm/s.

28 Claims, 5 Drawing Sheets

RATIONAL DIRECTIONAL SOLIDIFICATION CRYSTAL GROWTH SYSTEM AND METHOD

BACKGROUND OF INVENTION

1. Field of the Invention

This invention relates to a rotational directional solidification crystal growth system and method, and in particular, to a system and method using Coriolis and centrifugal forces caused by the rotation of a crucible or the system to grow crystals according to the Bridgman Method so as to reduce the nature convection caused by gravity, which will improve the axial and radial dopant distribution.

2. Description of the Related Art

In the various techniques of crystal growth, materials for growing a single crystal include semiconductors, organics, inorganics (oxides), metals, superconductors etc. Currently, the major methods for growing such crystals include the Czochralski method, the floating-zone method, the Bridgman method, and the gradient freeze method, which is similar to the Bridgman method.

Generally speaking, the crystal yield with the Czochralski method is higher than that of the Gradient Freeze Method, although the Czochralski method may produce more defects due to thermal stress. Therefore, such crystals, except silicon single crystals, are usually made ether by the Bridgman method or by the gradient freeze method, while floating-zone method is less suitable for large size crystals.

Figure 1:
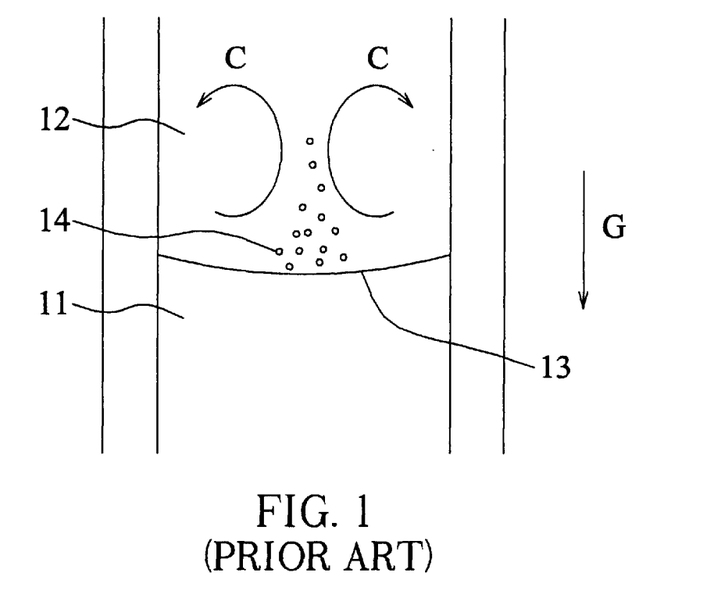
FIG. 1 is a schematic diagram showing the natural convective in a rotationless crystal growth system.
Figure 3A:
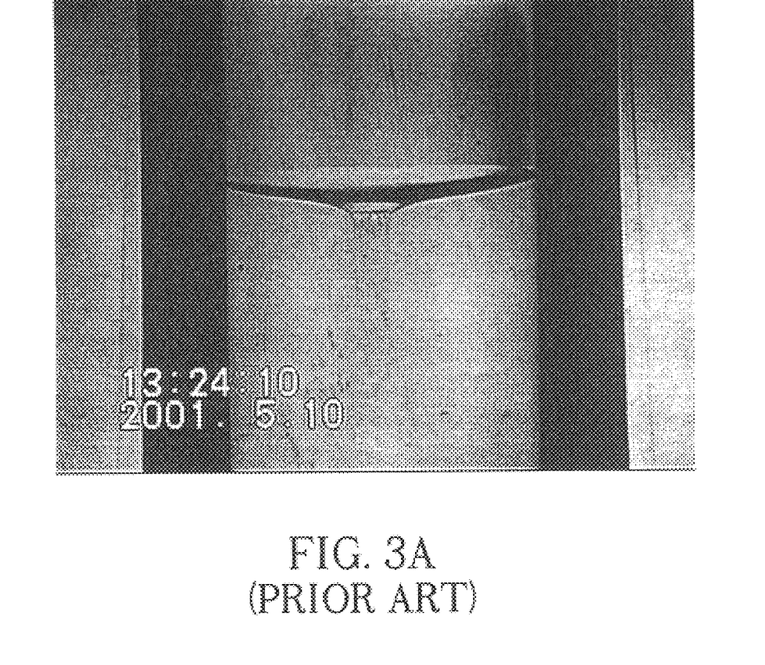
FIG. 3A is a schematic diagram showing the crystal in the rotationless crystal growth system.

In the Bridgman method, a crucible is moving in a furnace from a high-temperature zone to a low-temperature zone so as to change the temperature of the crucible. In contrast, in the gradient freeze method, the temperature of crucible is decreasing without moving the crucible. In both the Bridgman method and the gradient freeze method, the temperature of the environment is stable and single crystals can be grown steadily. Therefore, both methods can provide optimal crystal growth conditions to manufacture high quality and low defect single crystals. However, the growth of single crystals is always accompanied by solidification heat, so that, as shown in FIG. 1, interface 13, between solid crystal 11 and melt 12, is formed with a concave center. In this case, melt 12 can be any one of the materials mentioned above. Furthermore, the natural convection can concentrate dopant 14, which distributes in melt 12, at the central of interface 13. In other words, the nature convection will cause the axial and radial segregation of dopant 14 and will cause supercooling and breakdown in interface 13. As shown in FIG. 1, arrow G indicates the direction of gravity, and arrow C indicates the direction of natural convection. As described above, even though heat transfer is controlled accurately during crystal growth, the convection of melt 12 cannot be eliminated completely. Therefore, the crystals may have a poor dopant distribution, as shown in FIG. 3A. Thus, it is very important to control the convection so as to reduce the axial and radial segregation of the dopant so that the axial and radial distribution of dopant can be controlled efficiently.

In most conventional methods, for decreasing the effects of natural convection, an additional magnetic field is used to reduce the partial accumulation of dopant during crystal growth. However, the crystal growth system with a magnetic field is not only hard to be implemented and expensive, but it also hard to provide the magnetism efficiently around the crystal growth area to control the growth. Additionally, the system with a magnetic field can grow crystals only when the melt is electrically conductive.

Figure 2:
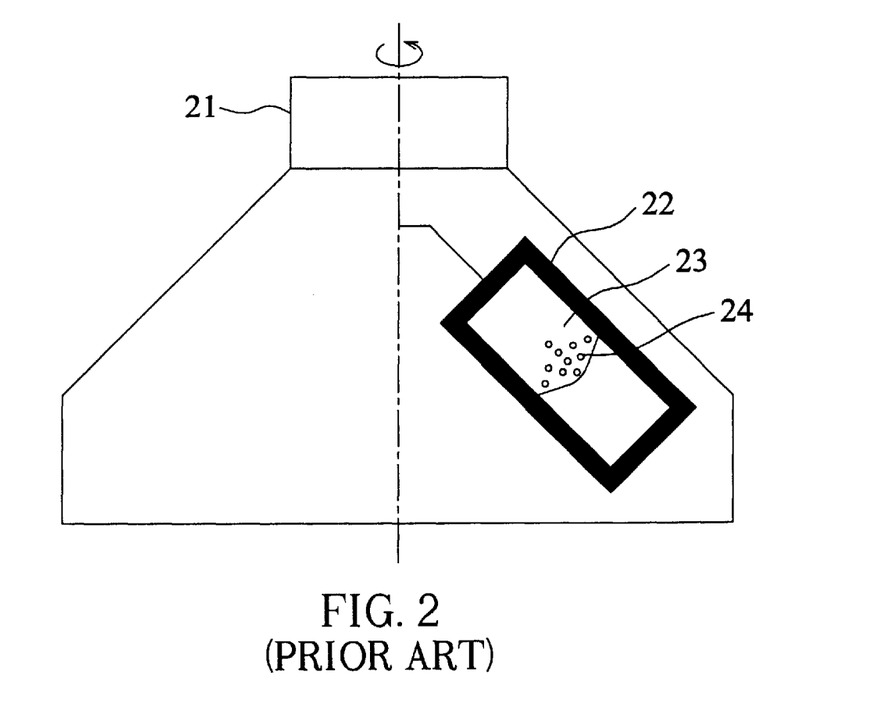
FIG. 2 is a schematic diagram showing a conventional centrifugal crystal growth system.

Referring to FIG. 2, currently a centrifugal force is used to reduce partial convection so as to improve the axial segregation. In this case, a large-scale centrifuge 21 is used to rotate the crucible 22, wherein the crucible 22, usually, is freely rotated. Therefore, the direction of resultant acceleration due to the centrifugal and the gravity forces is parallel with the axis of the crucible 22. However, the method mentioned above doesn't utilize the centrifugal force and the Coriolis force very well, so that the convection of melt 23 is a three-dimensional flow and the radial segregation of the dopant 24 is increased.

Therefore, it is an important issue under study to provide a system and method for reducing convection, and eliminating the segregation due to the central concave and breakdown interface, so as to decrease the axial and radial segregation and prevent the overcooling and breakdown of the interface.

SUMMARY OF THE INVENTION

An objective of the invention is to provide a rotational directional solidification crystal growth system and method for reducing the natural convection caused by gravity, so as to improve the distribution of the dopant and increase the quality of the crystals.

Another objective of the invention is to provide a system and method for eliminating concave center of the interface caused by the accumulation of dopant or solute, and enhancing the stability of interface.

To achieve the above objective, the rotational directional solidification crystal growth system according to the invention includes a furnace, a crucible, and a rotation support device. In this invention, the vertical furnace provides a high-temperature condition and a low-temperature condition. The crucible has a seed well and a growth region. The seed well contains a seed crystal, and the growth region contains a raw material and a dopant distributed in the raw material. The temperature of crucible can be changed depending on the high-temperature and low-temperature conditions so as to solidify the raw material and grow a directionally solidified single crystal. The rotation support device supports and rotates the crucible, wherein the tangent velocity of the rotated crucible is no less than $5\pi/3$ cm/s (centimeters per second).

This invention also provides a rotational directional solidification crystal growth method. The method includes the steps of providing a crucible, heating the crucible, rotating the crucible, and cooling the crucible. In this case, the tangent velocity of the rotated crucible is no less than $5\pi/3$ cm/s, and the raw material is solidified and the crystal is grown initiating from the seed crystal.

It is important that those who skilled in the art may rotate the crucible with low speed in order to increase uniformity of crucible heating. In other words, in conventional, the objective of rotation is to increase heating uniformity of crucible. Thus, the conventional objective is obviously different from that of the invention, and the tangent velocity of the rotated crucible is far smaller than what is claimed ($5\pi/3$ cm/s) in this invention.

According to the invention, the rotational directional solidification crystal growth system and method rotate the raw material and dopant in a tangent velocity of no less than $5\pi/3$ cm/s, so that centrifugal force and Coriolis force are sufficiently supplied to the raw material and dopant. Therefore, the central concave of interface caused by the dopant accumulation can be reduced, the stability of interface can be enhanced, and the nature convection can be counteracted so as to improve the distribution of dopant (both in axial and radial) and increase the quality of crystals.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

The invention will be apparent from the following detailed description, which proceeds with reference to the accompanying drawings, wherein the same references relate to the same elements.

Figure 4:
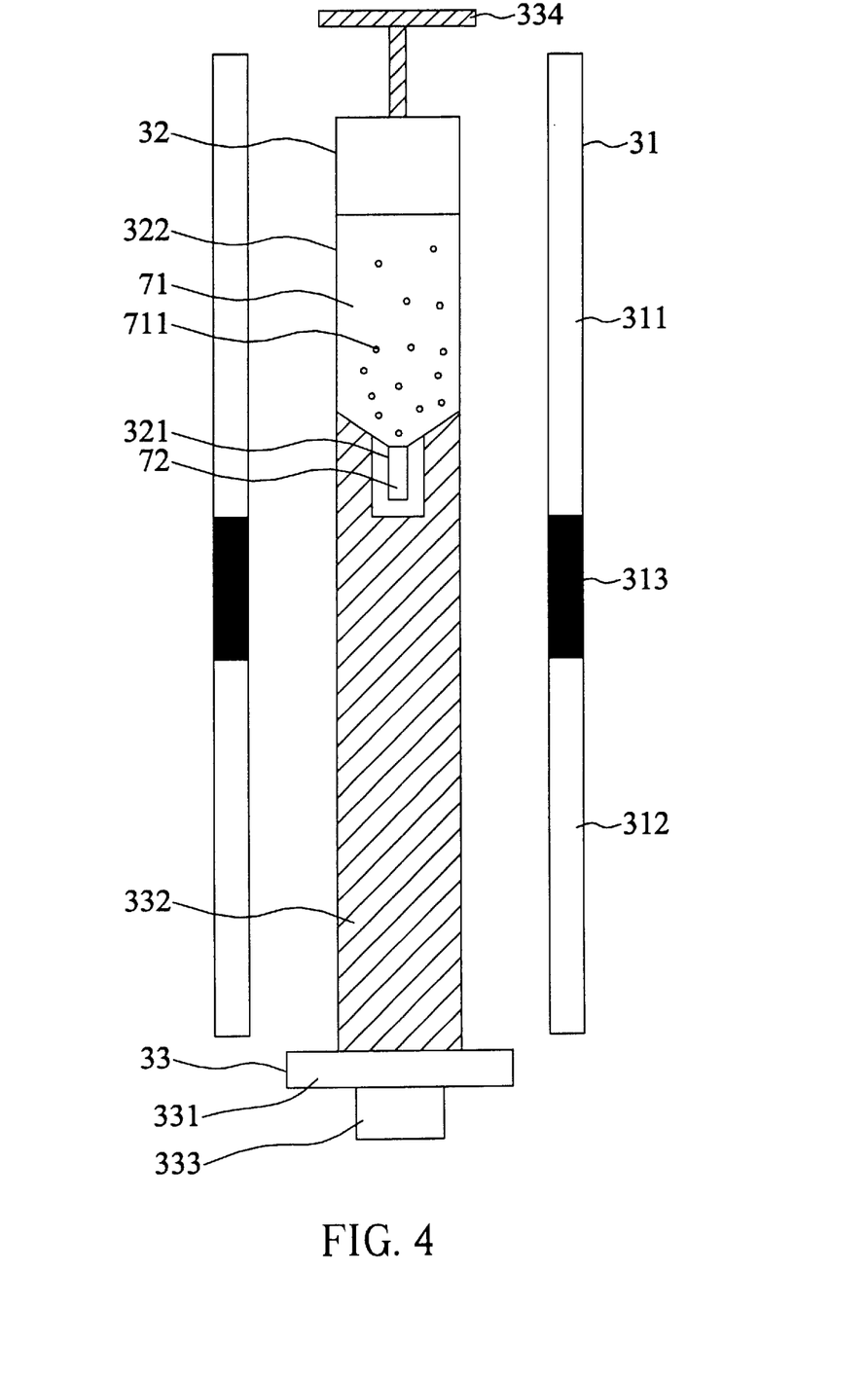
FIG. 4 is a schematic diagram showing the rotational directional solidification crystal growth system according to a preferred embodiment of this invention.

Referring to FIG. 4, a rotational directional solidification crystal growth system 3 comprises a furnace 31, a crucible 32, and a rotation support device 33.

The vertical furnace 31 includes a high-temperature portion 311, a low-temperature portion 312, and a thermal-insulation portion 313 between the portions 311 and 312. In this embodiment, the high-temperature portion 311 is in the upper portion of the furnace 31, the low-temperature portion 312 is in the lower portion of the furnace 31, and the thermal-insulation portion 313 is in the central of the furnace 31. The material (raw material 71 and dopant 711) used to grow the crystal can be an organic material, an oxide, a superconductor, a metal, a semiconductor, or any similar material. For example, organic materials such as Benzil doped with Neodymium; oxides such as $LiNbO_3$ doped with MgO or iron; superconductors such as $YBa_2Cu_3O_{6+x}$; metals such aluminum and copper; semiconductors such as GaP doped with silicon, GaAs and silicon, GaAs doped with selenium, $Si_xGe_{1-x}$, and CdTe doped with phosphorus. It should be noted that the superconductor includes $YBa_2Cu_3O_{6+x}$ with a different x such as $YBa_2Cu_3O_6$ and $YBa_2Cu_3O_7$; the semiconductor includes $Si_xGe_{1-x}$ with a different x; the oxide further includes $LiNbO_3$ and $LiTaO_3$, wherein the ratio of stoichiometric (Li:Nb or Li:Ta) is 1:1.

For instance, the raw material 71 includes Group IIIA and Group VA such as gallium and arsenic, so that the high-temperature 311 has to provide a temperature higher than the melting point of GaAs (Gallium Arsenide), and the low-temperature 312 has to provide a temperature lower than the melting point of GaAs.

The crucible 32 has a seed well 321 and a growth region 322. The seed well 321 is elongated at the bottom of the crucible 32 and contains a seed crystal 72. The growth region 322 is a cylindrical portion over the seed well 321 and contains the raw material 71 and dopant 711.

The rotation support device 33 can be set under the crucible 32 to support and rotate the crucible 32. As shown in FIG. 4, the rotate support device 33 includes a pedestal 331, a crucible shaft 332, a motor 333, and a shaft 334. The pedestal 331 supports the crucible 32 and mounts the crucible 32 on the crucible shaft 332. The crucible shaft 332 can transfer rotation to the crucible 32 and move the crucible 32 up and down. The motor 333 can provide the power to rotate and move the crucible 32. The shaft 334 and the crucible shaft 332 are coaxial, so that the crucible 32 can be coaxial rotated in the furnace 31 and moved from the high-temperature portion 311 to the low-temperature portion 312. The tangent velocity of the rotated crucible 32 is no less than $5\pi/3$ cm/s. In other words, the rotation speed of the crucible 32 is no less than 50 rpm (revolutions per minute) when the radius of the crucible 32 is 2 cm; the rotation speed of the crucible 32 is no less than 25 rpm when the radius of the crucible 32 is 4 cm. Furthermore, the system may further include a second motor and a linear rail so as to drive and control the crucible 32.

Figure 5:
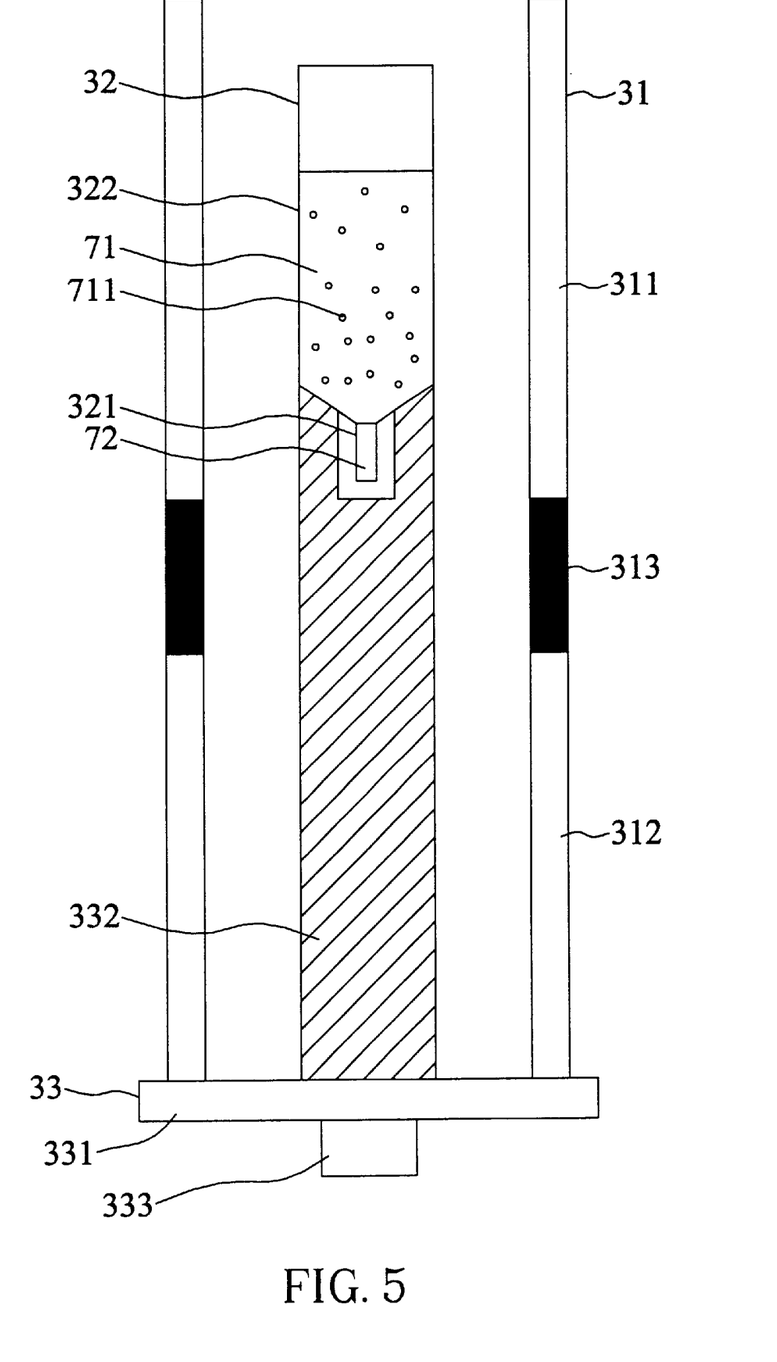
FIG. 5 is a schematic diagram showing the rotational directional solidification crystal growth system according to another preferred embodiment of this invention.

With referring to FIG. 5, in another preferred embodiment of this invention, the rotation support device 33 supports and rotates both of the furnace 31 and crucible 32. The device 33 includes pedestal 331, crucible shaft 332, and motor 333. The pedestal 331 supports the furnace 31 and crucible 32. The crucible 32 is mounted to the crucible shaft 332. The crucible shaft 332 can move the crucible 32 up and down. The motor 333 provides the power of rotation of the pedestal 331 and movement of the crucible shaft 332. Therefore, the furnace 31 and crucible 32 are substantially coaxially rotated, and the crucible 32 is moved vertically from the high-temperature portion 311 to the low-temperature portion 312. As described above, the rotation speeds of the furnace 31 and crucible 32 are the same. For example, the rotation speeds of the furnace 31 and crucible 32 can be 50 rpm, that is the tangent velocities of the furnace 31 and crucible 32 are $5\pi/3$ cm/s.

The related theory about the convection and segregation of dopant 711 in raw material 71 caused by the rotation of crucible 32 is illustrated in Journal of Crystal Growth 229 (2001) 406–418: Three-dimensional analysis of heat flow, segregation, and interface shape of gradient-freeze crystal growth in a centrifuge, and in Journal of Crystal Growth 229 (2001) 595–600: Effects of centrifugal acceleration on the flows and segregation in vertical Bridgman crystal growth with steady ampoule rotation. According to those papers, persons who skilled in the art should know that the rotation of crucible 32 can eliminate nature convection of the raw material 71, and reduce the axial and radial segregation of dopant 711.

Figure 3B:
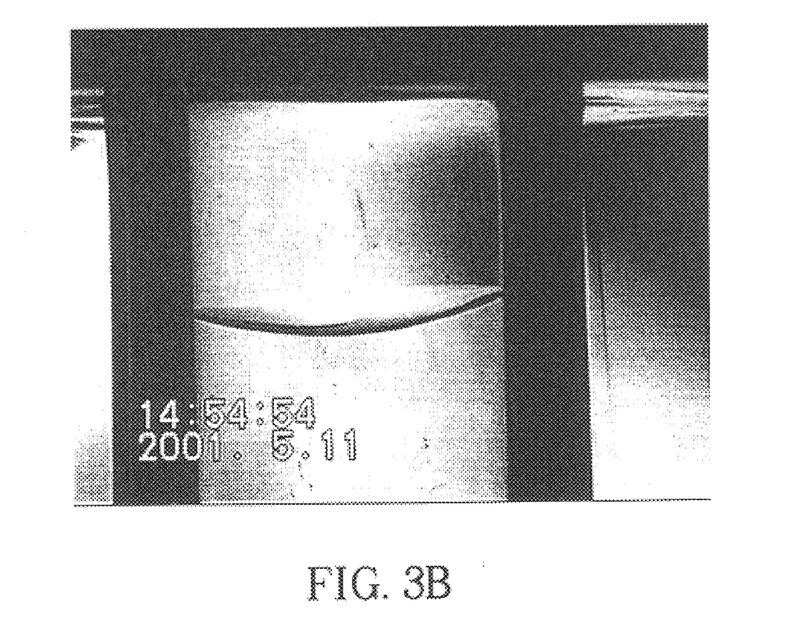
FIG. 3B is a schematic diagram showing the crystal in the rotational directional solidification crystal growth system according to a preferred embodiment of this invention.

FIG. 3A and FIG. 3B illustrate the growth of crystal which contains Succinonitrile and a small amount of Ethanol, wherein Ethanol serves as the dopant. In those cases, the growth speed is 2 $\mu$m/s. FIG. 3A shows the crystal growth when crucible 32 is not rotated, and FIG. 3B shows the crystal growth when crucible 32 is rotated in 150 rpm. With referring to those figures, it is clear that Ethanol may accumulate in the central of interface to speed the breakdown of the interface if the crucible 32 is not rotated, and there is no breakdown if crucible 32 is rotated.

Alternatively, the rotate support device 33 can be set over the crucible 32, and support and rotate the crucible 32.

Alternately, the rotation support device 33 does not move the crucible 32, and the furnace 31 is moved up and down, so that the crucible 32 and furnace 31 can be relatively moved, wherein the crucible 32 is relatively moved from the high-temperature portion 311 to low-temperature portion 312.

In another embodiment according to the invention, the furnace 31 can provide conditions from a high-temperature condition to a low-temperature condition, so that the temperature of the raw material 71, dopant 711, and seed crystal 72 in the crucible 32 can be provided in accordance with the Gradient Freeze Method. In this case, the rotation support device 33 provides rotation without movement to crucible 32.

To make the content of the invention clearer, an example is described hereinafter to illustrate a rotational directional solidification crystal growth method.

Figure 6:
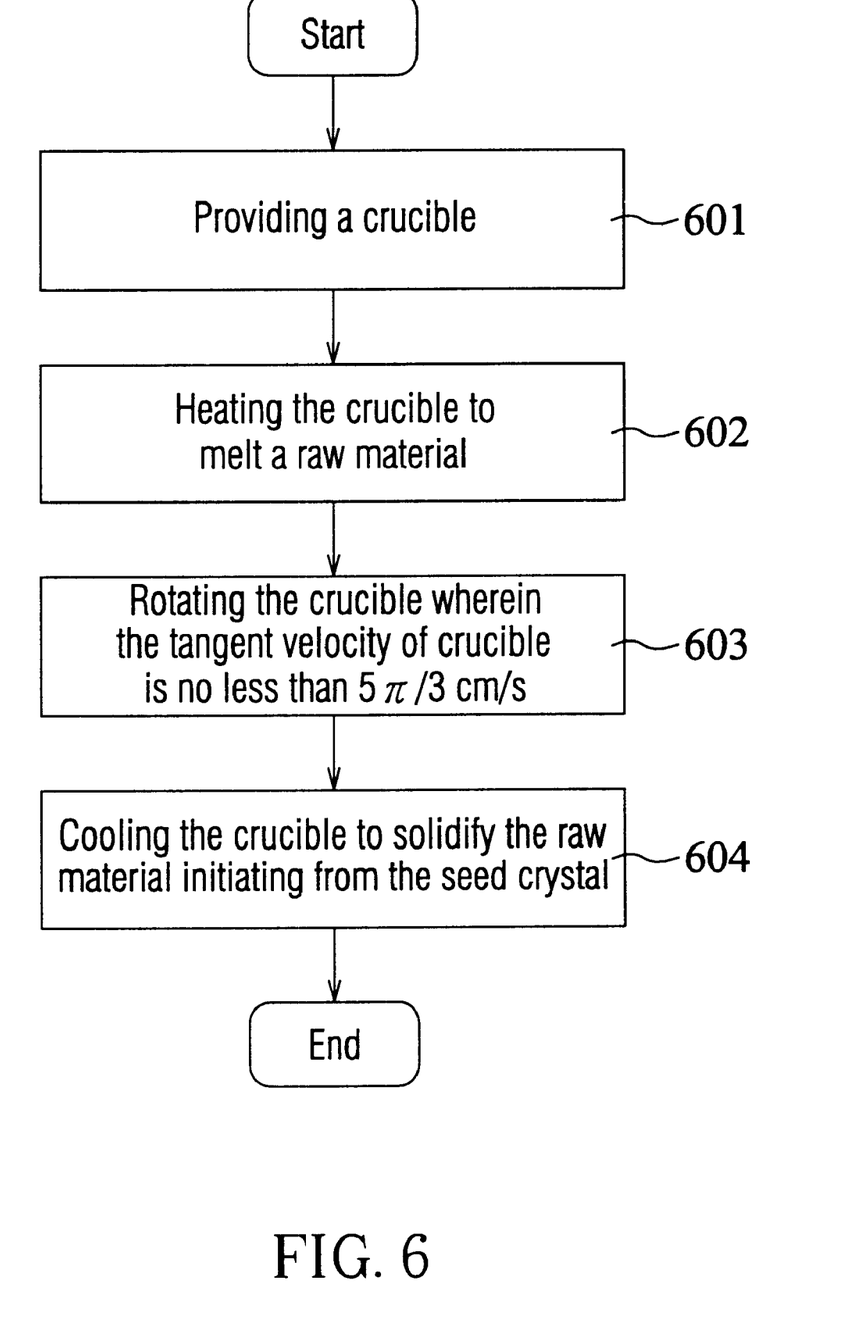
FIG. 6 is a flow chart showing a rotational directional solidification crystal growth method according to a preferred embodiment of this invention.

FIG. 6 illustrates a rotational directional solidification crystal growth method 6. In step 601, a crucible is provided, wherein the crucible contains a seed crystal, a raw material, and a dopant in the raw material. In this embodiment, the raw material is GaP (Group III–V compound), and the dopant is silicon.

In step 602, the crucible is heated to melt the raw material. In this case, because the raw material is GaP, the crucible must be heated over 1465° C. so as to melt the GaP.

As described above, the method 6 can heat the crucible in the high-temperature portion of furnace. In other words, it is necessary that the high-temperature portion provides a temperature higher than 1465° C.

In step 603, the crucible is rotated with the tangent velocity no less than 5π/3 cm/s. In other words, the rotation speed of the crucible is no less than 50 rpm if the radius of the crucible is 2 cm, and the rotation speed of the crucible is no less than 25 rpm if the radius of the crucible is 4 cm.

In step 604, the crucible is cooled to solidify the raw material initiating from seed crystal. In this embodiment, because the raw material is GaP, the crucible must be cooled under 1465° C. so as to solidify GaP.

As mentioned before, the crucible is cooled at the low-temperature portion of furnace, so that the crucible must be relatively moved corresponding to furnace from the high-temperature portion to low-temperature portion. Moving the furnace upward or moving the crucible downward can cause the relative movement of the crucible and furnace.

In summary, the system and method according to the invention rotate the crucible, which has a radius, for example, equal to 2 cm, in a rotation speed no less than 50 rpm, so that centrifugal force perpendicular with gravity force is applied to the raw material in the crucible. Thus, raw material has a convective flow counter to the natural convection, which is shown in FIG. 1 (the arrow C). Consequently, the central concave caused by the dopant accumulation can be eliminated, the natural convection can be counteracted, and the axial and radial segregation of the dopant can be decreased. Further, the overcooling and breakdown of interface caused by accumulation of dopant can be avoided.

While the invention has been described by way of an example and in terms of the preferred embodiment, it is to be understood that the invention is not limited to the disclosed embodiment. To the contrary, it is intended to cover various modifications and similar arrangements as would be apparent to those skilled in the art. For instance, the furnace can be designed according to the Gradient Freeze Method or the Bridgman Method, and a multi-heater can control the temperature of furnace. The rotation support device can rotate the crucible only or both the crucible and furnace. Therefore, the scope of the appended claims should be accorded the broadest interpretation so as to encompass all such modifications and similar arrangements.

What is claimed is:

1. A rotational directional solidification crystal growth system, comprising:
   a vertical furnace;
   a crucible having a seed well and a growth region, wherein the seed well contains a seed crystal, and the growth region contains raw material and a dopant which is distributed in the raw material; and
   a rotation support device, which supports and rotates the crucible, wherein the tangent velocity of the rotated crucible is no less than about 5π/3 cm/s.

2. The system of claim 1, further comprising:
   a shaft, wherein the rotation support device and the shaft are mounted on the opposite side of the crucible, so that the crucible is coaxially rotated in the furnace.

3. The system of claim 1, wherein the rotation support device further supports the furnace, so that the furnace and the crucible are coaxially rotated.

4. The system of claim 1, wherein the furnace further comprises a high-temperature portion for providing a high-temperature which supplies a temperature higher than the melting point of the raw material, and a low-temperature portion for providing a low-temperature, which supplies a temperature lower than the melting point of the raw material.

5. The system of claim 4, wherein the furnace further comprises a thermal-insulation portion between the high-temperature portion and the low-temperature portion.

6. The system of claim 4, wherein the rotation support device further moves the crucible vertically, so that the crucible rotates and moves from the high-temperature portion to the low-temperature portion.

7. The system of claim 4, wherein the furnace moves vertically, so that the crucible rotates and relatively moves in the furnace from the high-temperature portion to the low-temperature portion.

8. The system of claim 1, wherein the furnace provides a condition from high-temperature higher than the melting point of the raw material to low-temperature lower than the melting point of the raw material.

9. The system of claim 1, wherein the raw material is an organic material.

10. The system of claim 1, wherein the raw material is an oxide.

11. The system of claim 1, wherein the raw material is a superconductor.

12. The system of claim 1, wherein the raw material is a metal.

13. The system of claim 1, wherein the raw material is a semiconductor.

14. The system of claim 1, wherein the rotate support device is mounted over the crucible.

15. The system of claim 1, wherein the rotate support device is mounted under the crucible.

16. A rotational directional solidification crystal growth method, comprising:
   a crucible which contains a seed crystal and raw material;
   heating the crucible to melt the raw material;
   rotating the crucible, wherein the tangent velocity of the rotated crucible is no less than about 5π/3 cm/s; and
   cooling the crucible to solidify the raw material initiating from the seed crystal.

17. The method of claim 16, wherein the crucible has a seed well contains a seed crystal, and a growth region contains a raw material and a dopant distributed in the raw material.

18. The method of claim 16, wherein the crucible is set in a vertical furnace which comprises a high-temperature portion for supplying a temperature higher than the melting point of the raw material so as to heat the crucible and a low-temperature portion for supplying a temperature lower than the melting point of the raw material so as to cool the crucible.

19. The method of claim 18, wherein the crucible moves vertically so that the crucible moves in the furnace from the high-temperature portion to the low-temperature portion.

20. The method of claim 18, wherein the furnace further comprises a thermal-insulation portion between the high-temperature portion and the low-temperature portion.

21. The method of claim 18, wherein the furnace and the crucible are coaxially rotated.

22. The system of claim 1, wherein the crucible is coaxially rotated in the furnace.

23. The method of claim 16, wherein the crucible is set in a vertical furnace which provides a condition from high-temperature higher than the melting point of the raw material to low-temperature lower than that of the raw material.

24. The method of claim 16, wherein the raw material is an organic material.

25. The method of claim 16, wherein the raw material is an oxide.

26. The method of claim 16, wherein the raw material is a superconductor.

27. The method of claim 16, wherein the raw material is a metal.

28. The method of claim 16, wherein the raw material is a semiconductor.

* * * * *

UNITED STATES PATENT AND TRADEMARK OFFICE
CERTIFICATE OF CORRECTION

PATENT NO. : 6,645,294 B2
APPLICATION NO. : 10/034378
DATED : November 11, 2003
INVENTOR(S) : Cheng-Wen Lan Page 1 of 1

It is certified that error appears in the above-identified patent and that said Letters Patent is hereby corrected as shown below:

IN THE TITLE:

Item (54), and at column 1, lines 1-3, change the Title of the Invention to read as follows:

--ROTATIONAL DIRECTIONAL SOLIDIFICATION CRYSTAL GROWTH SYSTEM AND METHOD--.

Signed and Sealed this
Fourteenth Day of May, 2013

Teresa Stanek Rea
*Acting Director of the United States Patent and Trademark Office*